(12) United States Patent
Forbes

(10) Patent No.: US 7,241,654 B2
(45) Date of Patent: Jul. 10, 2007

(54) VERTICAL NROM NAND FLASH MEMORY ARRAY

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 364 days.

(21) Appl. No.: 10/738,783

(22) Filed: Dec. 17, 2003

(65) Prior Publication Data

US 2005/0133860 A1    Jun. 23, 2005

(51) Int. Cl.
*H01L 21/8246* (2006.01)

(52) U.S. Cl. .................. 438/209; 438/212; 438/270; 438/287; 438/424

(58) Field of Classification Search ............... 438/209, 438/212, 270, 287, 424; 257/E29.132, E29.133, 257/E21.375, E21.41, E21.423, E21.629, 257/E21.643
See application file for complete search history.

(56) References Cited

U.S. PATENT DOCUMENTS

| | | | |
|---|---|---|---|
| 4,184,207 A | 1/1980 | McElroy |
| 4,420,504 A | 12/1983 | Cooper |
| 4,558,344 A | 12/1985 | Perlegos |
| 4,630,085 A | 12/1986 | Koyama |
| 4,755,864 A | 7/1988 | Ariizumi |
| 4,774,556 A | 9/1988 | Fujii |
| 4,785,199 A | 11/1988 | Kolodny |
| 4,881,114 A | 11/1989 | Mohsen |
| 5,241,496 A | 8/1993 | Lowrey |
| 5,330,930 A | 7/1994 | Chi |
| 5,378,647 A | 1/1995 | Hong |
| 5,379,253 A | 1/1995 | Bergemont |
| 5,397,725 A | 3/1995 | Wolstenholme |
| 5,461,249 A | 10/1995 | Ozawa |
| 5,463,579 A | 10/1995 | Shimoji |
| 5,467,305 A | 11/1995 | Bertin |
| 5,576,236 A | 11/1996 | Chang |
| 5,620,913 A | 4/1997 | Lee |
| 5,768,192 A | 6/1998 | Eitan |
| 5,792,697 A | 8/1998 | Wen |

(Continued)

FOREIGN PATENT DOCUMENTS

EP        84303740.9        1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

*Primary Examiner*—George Fourson
(74) *Attorney, Agent, or Firm*—Leffert Jay & Polglaze,P.A.

(57) ABSTRACT

Memory devices, arrays, and strings are described that facilitate the use of NROM memory cells in NAND architecture memory strings, arrays, and devices. NROM NAND architecture memory embodiments of the present invention include NROM memory cells in high density vertical NAND architecture arrays or strings facilitating the use of reduced feature size process techniques. These NAND architecture vertical NROM memory cell strings allow for an improved high density memory devices or arrays that can take advantage of the feature sizes semiconductor fabrication processes are generally capable of and yet do not suffer from charge separation issues in multi-bit NROM cells.

21 Claims, 7 Drawing Sheets

U.S. PATENT DOCUMENTS

| | | | |
|---|---|---|---|
| 5,858,841 A | 1/1999 | Hsu | |
| 5,888,868 A | 3/1999 | Yamazaki | |
| 5,909,618 A | 6/1999 | Forbes | |
| 5,911,106 A | 6/1999 | Tasaka | |
| 5,936,274 A | 8/1999 | Forbes | |
| 5,946,558 A | 8/1999 | Hsu | |
| 5,966,603 A | 10/1999 | Eitan | |
| 5,973,352 A * | 10/1999 | Noble | 257/315 |
| 5,973,356 A | 10/1999 | Noble | |
| 5,973,358 A * | 10/1999 | Kishi | 257/324 |
| 5,991,225 A | 11/1999 | Forbes | |
| 5,994,745 A | 11/1999 | Hong | |
| 6,011,725 A | 1/2000 | Eitan | |
| 6,028,342 A | 2/2000 | Chang | |
| 6,030,871 A | 2/2000 | Eitan | |
| 6,044,022 A | 3/2000 | Nachumovsky | |
| 6,072,209 A | 6/2000 | Noble | |
| 6,081,456 A | 6/2000 | Dadashev | |
| 6,091,102 A | 7/2000 | Sekariapuram | |
| 6,104,061 A | 8/2000 | Forbes | |
| 6,108,240 A | 8/2000 | Lavi | |
| 6,133,102 A | 10/2000 | Wu | |
| 6,134,156 A | 10/2000 | Eitan | |
| 6,134,175 A | 10/2000 | Forbes | |
| 6,143,636 A | 11/2000 | Forbes | |
| 6,147,904 A | 11/2000 | Liron | |
| 6,150,687 A | 11/2000 | Noble | |
| 6,153,468 A | 11/2000 | Forbes | |
| 6,157,570 A | 12/2000 | Nachumovsky | |
| 6,172,396 B1 | 1/2001 | Chang | |
| 6,174,758 B1 | 1/2001 | Nachumovsky | |
| 6,175,523 B1 | 1/2001 | Yang | |
| 6,181,597 B1 | 1/2001 | Nachumovsky | |
| 6,184,089 B1 | 2/2001 | Chang | |
| 6,191,459 B1 * | 2/2001 | Hofmann et al. | 257/390 |
| 6,191,470 B1 | 2/2001 | Forbes | |
| 6,201,282 B1 | 3/2001 | Eitan | |
| 6,201,737 B1 | 3/2001 | Hollmer | |
| 6,204,529 B1 | 3/2001 | Lung | |
| 6,207,504 B1 | 3/2001 | Hsieh | |
| 6,208,164 B1 | 3/2001 | Noble | |
| 6,208,557 B1 | 3/2001 | Bergemont | |
| 6,215,702 B1 | 4/2001 | Derhacobian | |
| 6,218,695 B1 | 4/2001 | Nachumovsky | |
| 6,219,299 B1 | 4/2001 | Forbes | |
| 6,222,768 B1 | 4/2001 | Hollmer | |
| 6,222,769 B1 | 4/2001 | Maruyama | |
| 6,238,976 B1 | 5/2001 | Noble | |
| 6,240,020 B1 | 5/2001 | Yang | |
| 6,243,300 B1 | 6/2001 | Sunkavalli | |
| 6,249,460 B1 | 6/2001 | Forbes | |
| 6,251,731 B1 | 6/2001 | Wu | |
| 6,255,166 B1 | 7/2001 | Ogura | |
| 6,256,231 B1 | 7/2001 | Lavi | |
| 6,266,281 B1 | 7/2001 | Derhacobian | |
| 6,269,023 B1 | 7/2001 | Derhacobian | |
| 6,272,043 B1 | 8/2001 | Hollmer | |
| 6,275,414 B1 | 8/2001 | Randolph | |
| 6,282,118 B1 | 8/2001 | Lung | |
| 6,291,854 B1 | 9/2001 | Peng | |
| 6,297,096 B1 | 10/2001 | Boaz | |
| 6,303,436 B1 | 10/2001 | Sung | |
| 6,327,174 B1 | 12/2001 | Jung | |
| 6,337,808 B1 | 1/2002 | Forbes | |
| 6,348,711 B1 | 2/2002 | Eitan | |
| 6,377,070 B1 | 4/2002 | Forbes | |
| 6,380,585 B1 | 4/2002 | Odanaka | |
| 6,383,871 B1 | 5/2002 | Noble | |
| 6,384,448 B1 | 5/2002 | Forbes | |
| 6,392,930 B2 | 5/2002 | Jung | |
| 6,417,049 B1 | 7/2002 | Sung | |
| 6,417,053 B1 | 7/2002 | Kuo | |
| 6,421,275 B1 | 7/2002 | Chen | |
| 6,424,001 B1 | 7/2002 | Forbes | |
| 6,429,063 B1 | 8/2002 | Eitan | |
| 6,432,778 B1 | 8/2002 | Lai | |
| 6,436,764 B1 | 8/2002 | Hsieh | |
| 6,448,601 B1 | 9/2002 | Forbes | |
| 6,448,607 B1 | 9/2002 | Hsu | |
| 6,461,949 B1 | 10/2002 | Chang | |
| 6,468,864 B1 | 10/2002 | Sung | |
| 6,469,342 B1 | 10/2002 | Kuo | |
| 6,476,434 B1 | 11/2002 | Noble | |
| 6,477,084 B1 | 11/2002 | Eitan | |
| 6,486,028 B1 * | 11/2002 | Chang et al. | 438/259 |
| 6,487,050 B1 | 11/2002 | Liu | |
| 6,492,233 B2 * | 12/2002 | Forbes et al. | 438/270 |
| 6,496,034 B2 | 12/2002 | Forbes | |
| 6,498,377 B1 | 12/2002 | Lin | |
| 6,514,831 B1 | 2/2003 | Liu | |
| 6,531,350 B2 * | 3/2003 | Satoh et al. | 438/197 |
| 6,531,887 B2 | 3/2003 | Sun | |
| 6,545,309 B1 | 4/2003 | Kuo | |
| 6,552,387 B1 | 4/2003 | Eitan | |
| 6,559,013 B1 | 5/2003 | Pan | |
| 6,566,682 B2 | 5/2003 | Forbes | |
| 6,569,715 B1 * | 5/2003 | Forbes | 438/138 |
| 6,576,511 B2 | 6/2003 | Pan | |
| 6,577,533 B2 | 6/2003 | Sakui | |
| 6,580,135 B2 | 6/2003 | Chen | |
| 6,580,630 B1 | 6/2003 | Liu | |
| 6,597,037 B1 | 7/2003 | Forbes | |
| 6,602,805 B2 | 8/2003 | Chang | |
| 6,607,957 B1 | 8/2003 | Fan | |
| 6,610,586 B1 | 8/2003 | Liu | |
| 6,613,632 B2 | 9/2003 | Liu | |
| 6,617,204 B2 | 9/2003 | Sung | |
| 6,639,268 B2 | 10/2003 | Forbes | |
| 6,642,572 B2 | 11/2003 | Kusumi | |
| 6,657,250 B1 | 12/2003 | Rudeck | |
| 6,680,508 B1 | 1/2004 | Rudeck | |
| 6,707,079 B2 * | 3/2004 | Satoh et al. | 257/288 |
| 6,720,216 B2 | 4/2004 | Forbes | |
| 6,744,094 B2 | 6/2004 | Forbes | |
| 6,762,955 B2 | 7/2004 | Sakui | |
| 6,768,162 B1 | 7/2004 | Chang | |
| 6,844,589 B2 * | 1/2005 | Kim | 257/324 |
| 7,049,196 B2 * | 5/2006 | Noble | 438/268 |
| 2001/0001075 A1 | 5/2001 | Ngo | |
| 2001/0004332 A1 | 6/2001 | Eitan | |
| 2001/0011755 A1 | 8/2001 | Tasaka | |
| 2001/0022375 A1 | 9/2001 | Hsieh | |
| 2002/0028541 A1 * | 3/2002 | Lee et al. | 438/149 |
| 2002/0036308 A1 * | 3/2002 | Endoh et al. | 257/298 |
| 2002/0130356 A1 | 9/2002 | Sung | |
| 2002/0142569 A1 | 10/2002 | Chang | |
| 2002/0146885 A1 | 10/2002 | Chen | |
| 2002/0149081 A1 | 10/2002 | Goda | |
| 2002/0151138 A1 | 10/2002 | Liu | |
| 2002/0177275 A1 | 11/2002 | Liu | |
| 2002/0182829 A1 | 12/2002 | Chen | |
| 2003/0015755 A1 * | 1/2003 | Hagemeyer | 257/329 |
| 2003/0042512 A1 | 3/2003 | Gonzalez | |
| 2003/0043637 A1 | 3/2003 | Forbes | |
| 2003/0057997 A1 | 3/2003 | Sun | |
| 2003/0067807 A1 | 4/2003 | Lin | |
| 2003/0075758 A1 * | 4/2003 | Sundaresan et al. | 257/329 |
| 2003/0104665 A1 * | 6/2003 | Nakai | 438/200 |
| 2003/0113969 A1 | 6/2003 | Cho | |
| 2003/0117861 A1 | 6/2003 | Maayan | |
| 2003/0134478 A1 | 7/2003 | Lai | |
| 2003/0139011 A1 * | 7/2003 | Cleeves et al. | 438/257 |
| 2003/0235075 A1 | 12/2003 | Forbes | |
| 2003/0235076 A1 | 12/2003 | Forbes | |

| | | | |
|---|---|---|---|
| 2003/0235079 | A1 | 12/2003 | Forbes |
| 2004/0016953 | A1 | 1/2004 | Lindsay |
| 2004/0041203 | A1 | 3/2004 | Kim |
| 2004/0063283 | A1 | 4/2004 | Guterman |
| 2004/0155284 | A1* | 8/2004 | Kim ........................... 257/324 |
| 2005/0032308 | A1 | 2/2005 | Hsiao |

FOREIGN PATENT DOCUMENTS

| | | |
|---|---|---|
| EP | 0 485 018 A2 | 11/1990 |
| EP | 90115805.5 | 2/1991 |
| EP | 0 562 257 A1 | 9/1993 |
| EP | 01113179.4 | 12/2002 |
| EP | 1 271 652 A | 1/2003 |
| JP | 01053577 | 1/1989 |
| JP | 05251711 | 9/1993 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE 41$^{st}$ Annual International Reliability Physics Symposium, Dallas, TX (2003), pp. 502-505, Copyright 1989 IEEE.

S. Minami and Y. Kamigaki, "A Novel MONOS Nonvolatile Memory Device Ensuring 10-Year Data Retention after 10$^7$ Erase/Write Cycles," IEEE Transactions on Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "E$^2$PROM Product Issues and Technology Trends," IEEE 1989, pp. 17-19, Copyright 1989 IEEE.

T. Huang, F. Jong, T. Chao, H. Lin, L. Leu, K. Young, C. Lin, K. Chiu, "Improving Radiation Hardness of EEPROM/Flash Cell BY N$_2$0 Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide-Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With A TiSi$_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp. 187-187.3, date unknown.

T. Sugizaki, et al. "New 2-bit/Tr MONOS Type Flash Memory using Al$_2$O$_3$ as Charge Trapping Layer," Fujitsu Laboratories Ltd, date unknown.

T. Saito, et al. "Hot Hole Erase Characteristics and Reliability in Twin MONOS Device" Halo LSI, date unknown.

Saifun Semiconductors, LTD. PowerPoint Presentation, date unknown.

Y. Roizin, et al. "Novel Techniques for data retention and Leff measurements in two bit *Micro*Flash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40$^{th}$ Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subthreshold slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50.

I. Bloom, et al., "NROM™—a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., date unknown.

L. Breuil, et al., "A new 2 isolated-bits/cell flash memory device with self aligned split gate structure using ONO stacks for charge storage," IMEC, date unknown.

J. Willer, et al., "UMEM: A U-shape Non-Volatile-Memory Cell," Igentix GmbH &Co. KG., Infineon Technologies and Saifun Semiconductors, date unknown.

S. Kang, et al., "A Study of SONOS Nonvolatile Memory Cell Controlled Structurally by Localizing Charge-Trapping Layer," Samsung Electrons Co., Ltd., date unknown.

Y. Roizin, et al., "In-Process Charging in *micro*FLASH® Memory Cells," Tower Semiconductor, Ltd., date unknown.

I. Fujiwara, et al., "High speed program/erase sub 100 nm MONOS memory cell," Sony Corporation, date unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., date unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, date unknown.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., date unknown.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, date unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, date unknown.

Y. Roizin, et al., "Retention Characteristics of microFLASH® Memory (Activation Energy of Traps in the ONO Stack)," Tower Semiconductor, Ltd., date unknown.

Y. Roizin, et al., "Activation Energy of Traps in the ONO Stack of microFLASH® Memory Cells," Tower Semiconductor, Ltd., date unknown.

Y. Roizin, et al., "'Dummy' Gox for Optimization of microFLASH® Technology," Tower Semiconductor, Ltd., date unknown.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., date unknown.

J. Bu, et al., "Retention Reliability Enhanced SONOS NVSM with Scaled Programming Voltage," Microelectronics Lab., date unknown.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

P. Cappelletti, et al, "Failure Mechanisms of Flash Cell in Program/Erase Cycling", IEEE, 1994, IEDM, pp. 291-294.

H. Guan, et al, "On Scaling of SST Split-Gate Flash Memory Technologies", Department of Electrical and Computer Engineering, University of California, Irvine, Final Report 1998-1999 for MICRO Project 98-080.

P. Pavan, et al, "Flash Memory Cells—an Overview" Proceedings of the IEEE, vol. 85, No. 8, Aug. 1997, pp. 1248-1271.

S. Jin Ho, et al, "Charge-to-Breakdown Characteristics of Thin Gate Oxide and Buried Oxide on SIMOX SOI Wafers", Journal of the Electrochemical Society, vol. 144, No. 1, Jan. 1997, pp. 375-378.

U.S. Appl. No. 10/738,556, filed Dec. 17, 2003, Forbes.

U.S. Appl. No. 10/769,116, filed Jan. 30, 2004, Forbes.

U.S. Appl. No. 10/785,310, filed Feb. 24, 2004, Forbes.

\* cited by examiner

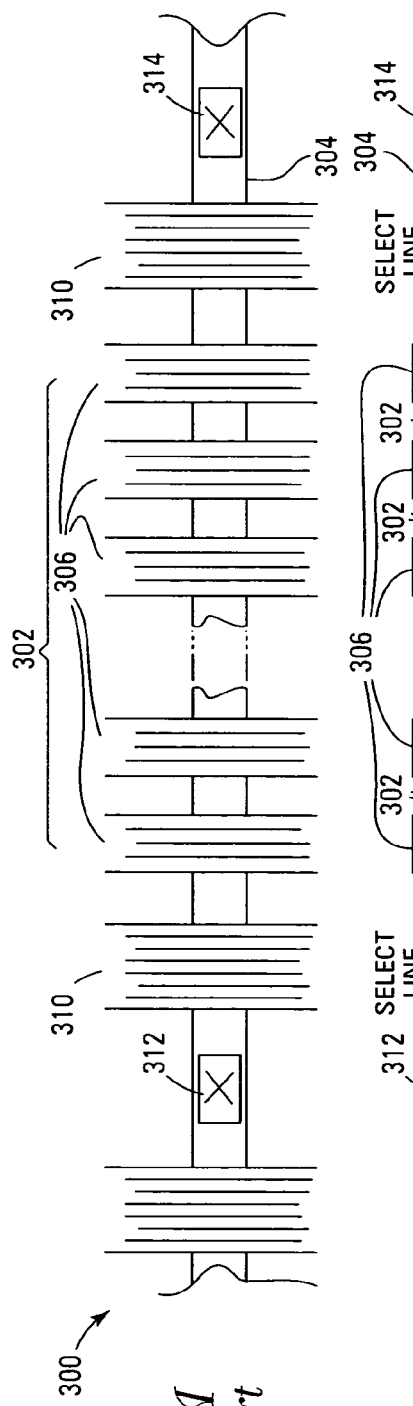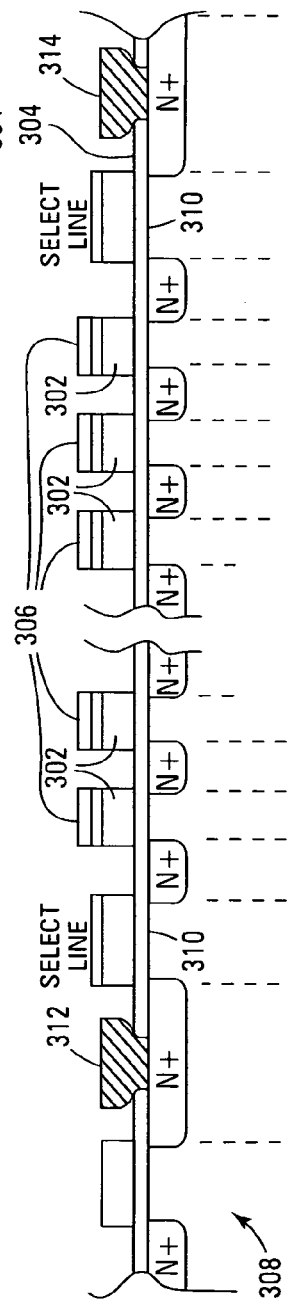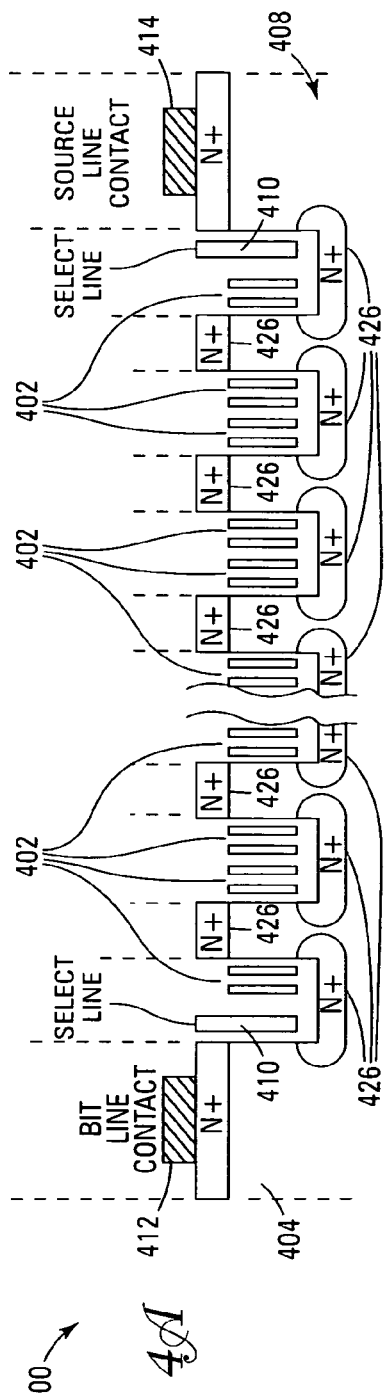

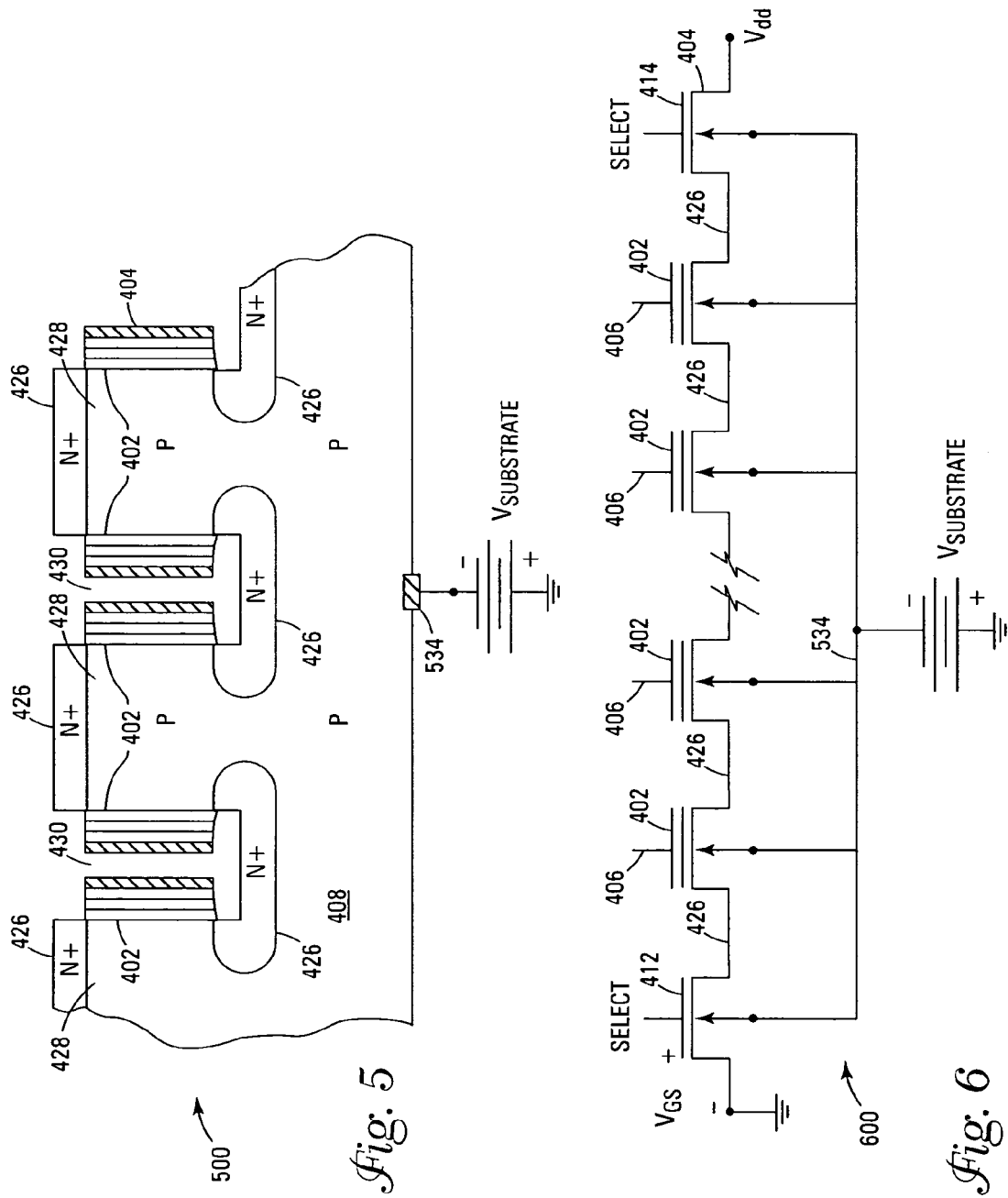

VERTICAL NROM NAND FLASH MEMORY ARRAY

TECHNICAL FIELD OF THE INVENTION

The present invention relates generally to integrated circuits and in particular the present invention relates to nitride read only memory Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that is typically erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." The memory cells of a Flash memory array are typically arranged into a "NOR" architecture (each cell directly coupled to a bit line) or a "NAND" architecture (cells coupled into "strings" of cells, such that each cell is coupled indirectly to a bit line and requires activating the other cells of the string for access). Each of the cells within an erase block can be electrically programmed in a random basis by charging the floating gate. The charge can be removed from the floating gate by a block erase operation, wherein all floating gate memory cells in the erase block are erased in a single operation.

One recent type of Flash memory is a nitride read only memory (NROM). NROM has some of the characteristics of Flash memory but does not require the special fabrication processes of a conventional Flash memory, thus NROM integrated circuits can be implemented using a standard CMOS process. Because of their unique device characteristics, some NROM memory cells can also store multiple data bits in each cell (typically two bits each).

FIG. 1 illustrates a cross-sectional view of a typical prior art NROM memory cell with a channel length, L. The cell is comprised of a control gate 100 formed on top of an oxide-nitride-oxide (ONO) layer. This layer is comprised of an oxide layer 101 on top of a nitride 103 layer upon which the charge is stored for the various states of the cell. In one embodiment, the cell has trapping areas 105 and 106 for storing two bits of data on the nitride layer 103. The nitride layer 103 is deposited on another oxide layer 104 that is on the substrate.

Two source/drain regions 109 and 111 are at either end of the gate 100. The source/drain regions 109 and 111 are connected by a channel area 110 between the two source/drain regions 109 and 111. The function of each source/drain region 109 or 111 (i.e., whether source or drain) depends upon which bit trapping area 105 or 106 is being read or written. For example, in a read operation, if the carrier is input at the left side source/drain region 111 and output from the right side region 109, the left side is the source 111 and the right side is the drain 109 and the data bit charge is stored on the nitride 103 at the source end 111 for bit trapping area 106.

As integrated circuit processing techniques improve, manufacturers try to reduce the feature sizes of the devices produced and thus increase the density of the IC circuits and memory arrays. In many cases, the feature sizes of the devices are limited by the device characteristics before the minimum feature size that the process is capable of is reached. In NROM devices in particular, as the channel length is reduced, a minimum size is typically reached that is primarily dictated by the device operational characteristics. FIG. 2 illustrates a typical prior art planar NROM device that has a channel length that is less than 100 nm. In this case, the channel length is so short that the trapping areas 205 and 206 of the two data bits/cell NROM device overlap. This overlap may cause data write and read errors.

For the reasons stated above, and for other reasons stated below which will become apparent to those skilled in the art upon reading and understanding the present specification, there is a need in the art for a method and architecture for producing a smaller multiple-bit NROM device array without trapping area overlap.

SUMMARY OF THE INVENTION

The above-mentioned problems with producing high density multiple-bit NROM device arrays without trapping area overlap and other problems are addressed by the present invention and will be understood by reading and studying the following specification.

NROM NAND architecture memory devices and arrays, in accordance with embodiments of the present invention, facilitate the utilization of NROM memory cells in high density NAND architecture arrays or strings with modern reduced feature size process techniques. Memory embodiments of the present invention utilize vertical NROM memory cells to form NAND architecture memory cell strings and memory arrays. These NAND architecture vertical NROM memory cell strings allow for improved high density memory devices or arrays that can take advantage of the feature sizes the semiconductor fabrication processes are generally capable of and yet do not suffer from charge separation issues in typical multi-bit NROM cells.

For one embodiment, the invention provides a vertical NROM NAND memory cell string comprising a substrate, comprising one or more raised areas defining trenches therebetween, a plurality of NROM memory cells, wherein the NROM memory cells are formed vertically on the sidewalls of one or more raised areas, and wherein the plurality of NROM memory cells are coupled in a serial string by source/drain regions formed at the top of the one or more raised areas and at the bottom of the one or more trenches.

For another embodiment, the invention provides a vertical NROM NAND memory array comprising a substrate, comprising a plurality of pillars and associated intervening trenches, a plurality of NROM memory cells, wherein the NROM memory cells are formed vertically on the sidewalls of the plurality of pillars, and wherein the plurality of NROM memory cells are coupled into a plurality of NAND architecture memory strings by source/drain regions formed at the top of the plurality of pillars and at the bottom of the associated trenches.

For yet another embodiment, the invention provides a system comprising a processor coupled to at least one memory device. The at least one memory device comprising a NROM NAND architecture memory array formed on a substrate having a plurality of pillars and associated intervening trenches, a plurality of NROM memory cells, wherein the NROM memory cells are formed vertically on the sidewalls of the plurality of pillars and trenches, and wherein the plurality of NROM memory cells are coupled into a plurality of NAND architecture memory strings by source/drain regions formed at the top of the plurality of pillars and at the bottom of the associated trenches.

For a further embodiment, the invention provides a method of forming a vertical NROM NAND architecture memory cell string comprising forming one or more raised areas on a substrate, the raised areas defining intervening trenches, forming a plurality of NROM memory cells on the sidewalls of the one or more raised areas, and forming one or more source/drain regions on the top of the one or more raised areas and at the bottom of the intervening trenches.

For yet a further embodiment, the invention provides a method of forming a vertical NROM NAND architecture memory array comprising forming a plurality of pillars and associated intervening trenches on a substrate, forming a plurality of NROM memory cells on the sidewalls of the plurality of pillars, and forming one or more source/drain regions on the top of the plurality of pillars and at the bottom of the associated intervening trenches to form a plurality of NROM NAND architecture memory strings.

Other embodiments are also described and claimed.

BRIEF DESCRIPTION OF THE DRAWINGS

FIGS. 3A and 3B detail a planar NAND Flash memory array of the prior art.

FIGS. 4A–4D details vertical NROM NAND Flash memory cells and array strings in accordance with embodiments of the present invention.

FIG. 5 details vertical NAND NROM cells and substrate in accordance with embodiments of the present invention.

FIG. 6 details a schematic of a vertical NAND NROM string in accordance with embodiments of the present invention.

DETAILED DESCRIPTION OF THE INVENTION

Figure 1:
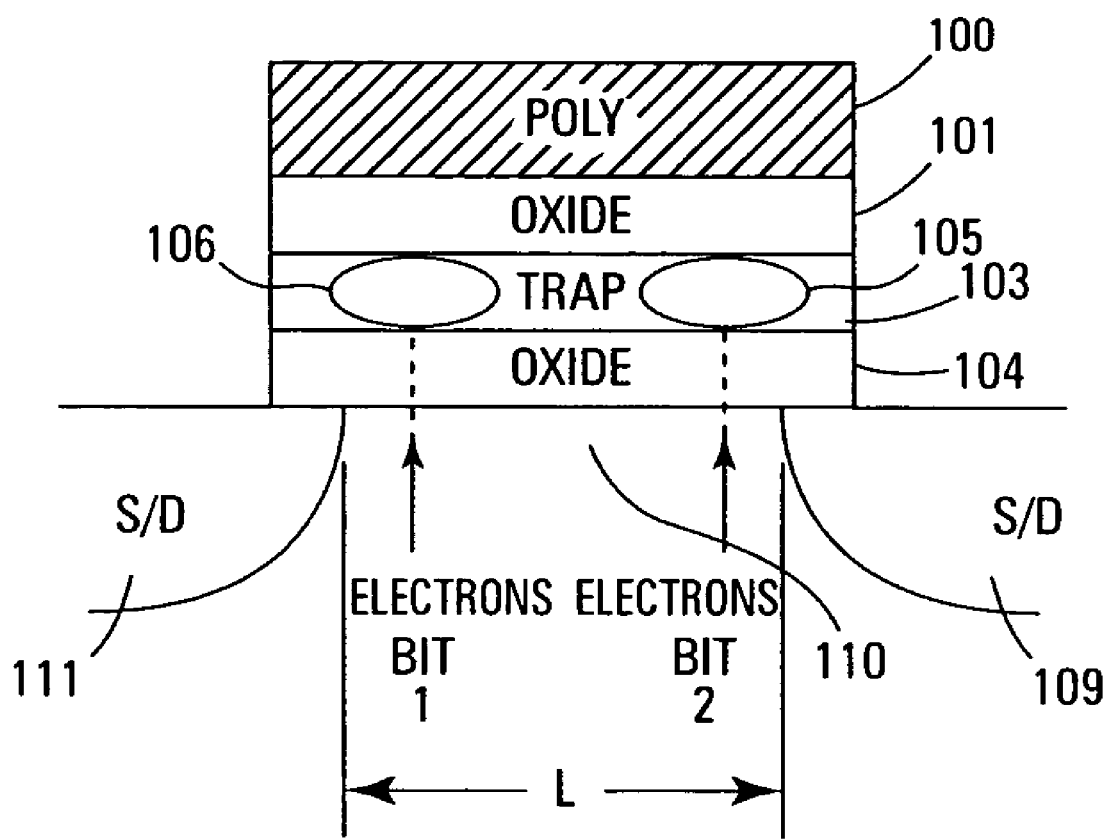
FIG. 1 shows a cross-sectional view of a typical prior art NROM cell.
Figure 2:
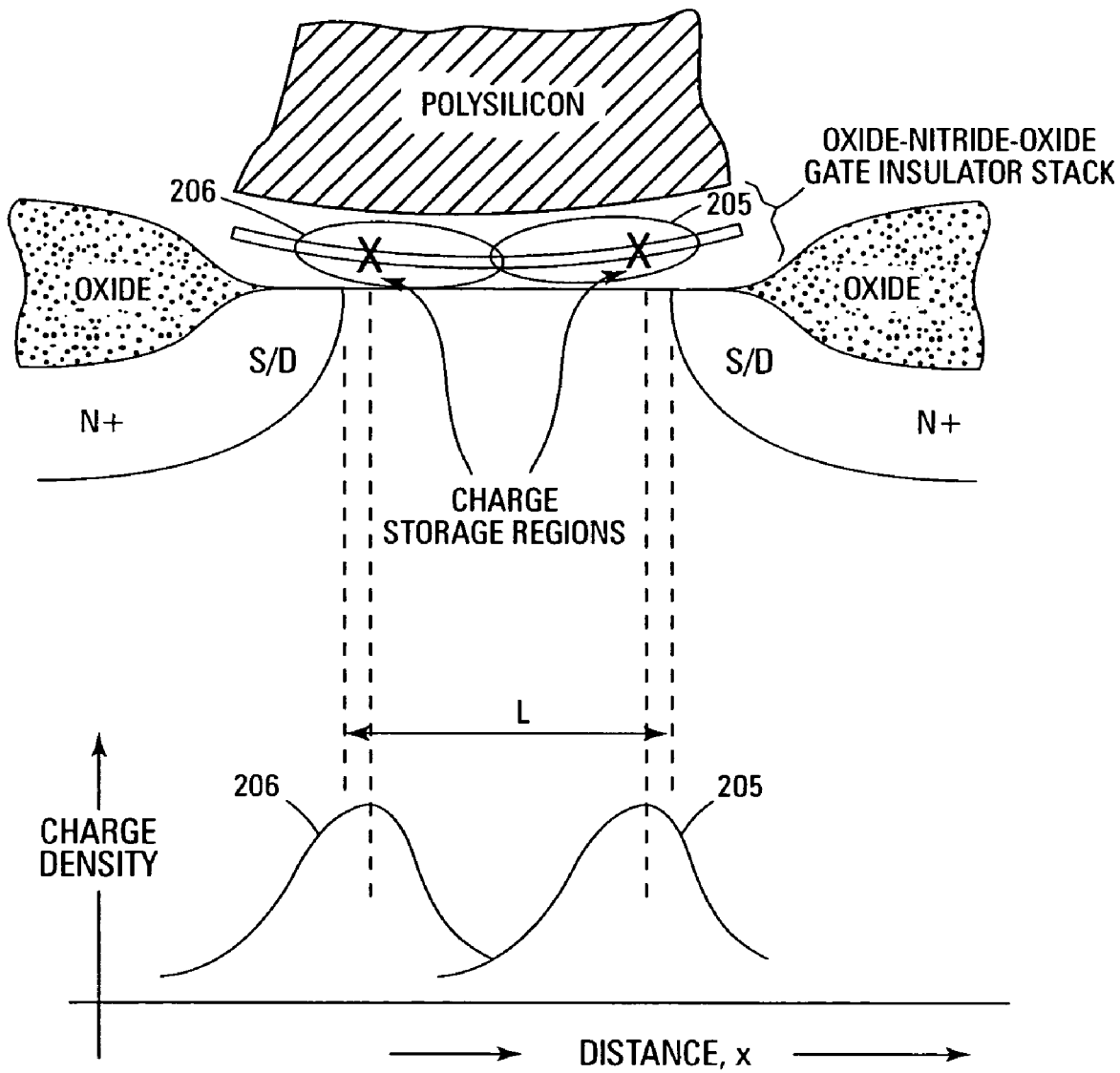
FIG. 2 shows a cross-sectional view of a typical prior art NROM cell with a channel less than 100 nm.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

Memory strings, arrays, and devices in accordance with embodiments of the present invention, facilitate the use of NROM memory cells in high density vertical NAND architecture memory strings, arrays, and devices. NROM NAND architecture memory embodiments of the present invention utilize NROM memory cells in high density vertical NAND architecture arrays or strings, facilitating the use of reduced feature size process techniques, e.g., 0.1 µm or below. Memory embodiments of the present invention include vertical NROM memory cells to form NAND architecture memory cell strings and memory arrays. These NAND architecture vertical NROM memory cell strings allow for an improved high density memory devices or arrays that can take advantage of the feature sizes semiconductor fabrication processes are generally capable of and yet not suffer from charge separation issues.

As stated above, many conventional NROM memory cells suffer from problems with charge separation in multi-bit utilizations when the channel length of the cell gets too small. As a result, the maximum density of an array of typical NROM memory cells can be limited by the need to maintain charge separation, even if the process technology can attain even smaller features and/or channel lengths. In particular, this is an issue in higher capacity memory types, such as NAND architecture Flash arrays and devices, where small changes in the memory cell footprint (e.g., memory cell channel widths) can have a large effect on the overall cell density in the array and the resulting storage capacity. By constructing NROM memory cells/gates in a vertical orientation, embodiments of the present invention allow for increases in memory array cell density and improved utilization of process minimum feature size capabilities while maintaining an appropriate NROM memory cell channel length to allow for effective charge separation.

As previously stated, the two common types of Flash memory array architectures are the "NAND" and "NOR" architectures, so called for the similarity each basic memory cell configuration has to the corresponding logic gate design. In the NOR array architecture, the NROM memory cells of the memory array are arranged in a matrix similar to RAM or ROM. The gates of each NROM memory cell of the array matrix are coupled by rows to word select lines (word lines) and their drains are coupled to column bit lines. The source of each NROM memory cell is typically coupled to a common source line. The NOR architecture NROM memory array is accessed by a row decoder activating a row of NROM memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the Flash memory.

A NAND array architecture also arranges its array of NROM memory cells in a matrix such that the gates of each NROM memory cell of the array are coupled by rows to word lines. However each memory cell is not directly coupled to a source line and a column bit line. Instead, the memory cells of the array are arranged together in strings, typically of 8 16, 32, or more each, where the memory cells in the string are coupled together in series, source to drain, between a common source line and a column bit line. This allows a NAND Flash array architecture to have a higher memory cell density than a comparable NOR Flash array, but with the cost of a generally slower access rate and programming complexity.

A NAND architecture NROM memory array is accessed by a row decoder activating a row of NROM memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each NROM memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the Flash memory.

FIGS. 3A and 3B show a simplified planar NROM NAND Flash memory array of the prior art. FIG. 3A details a top view of a planar NROM NAND Flash memory string 304 of a NROM NAND Flash memory array 300, a side view of the planar NROM NAND Flash memory string 304 is detailed in FIG. 3B. In FIGS. 3A and 3B, a series of NROM memory cells 302 are coupled together in a series NROM NAND string 304 (typically of 8, 16, 32, or more cells). Each NROM memory cell 302 has a gate-insulator stack that is made of a tunnel insulator (typically of an oxide) on top of a substrate 308, a trapping layer (typically of nitride) formed on the tunnel insulator, an intergate insulator formed over the trapping layer, and a control gate 306 (typically formed in a control gate line, also known as a word line) formed over the intergate insulator. N+ doped regions are formed between each gate insulator stack to form the source and drain regions of the adjacent floating gate memory cells; which additionally operate as connectors to couple the cells of the NAND string 304 together. Select gates 310, that are coupled to gate select lines, are formed at either end of the NAND floating gate string 304 and selectively couple opposite ends of the NAND floating gate string 304 to a bit line contact 312 and a source line contact 314.

Figure 4B:
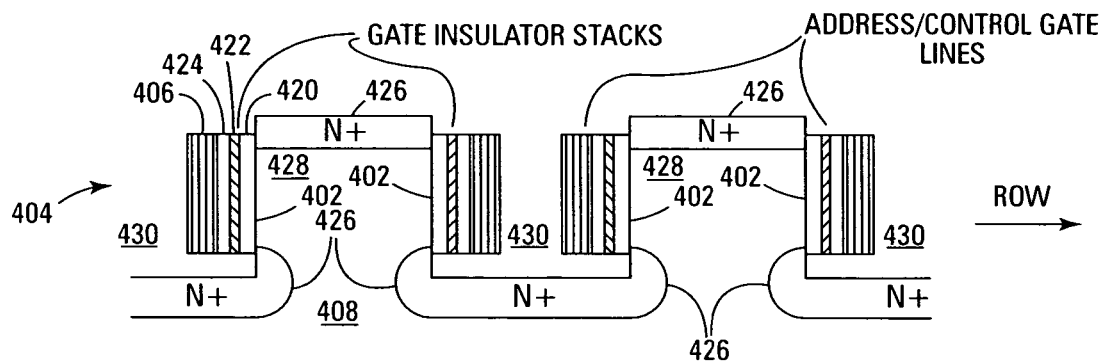
Figure 4C:
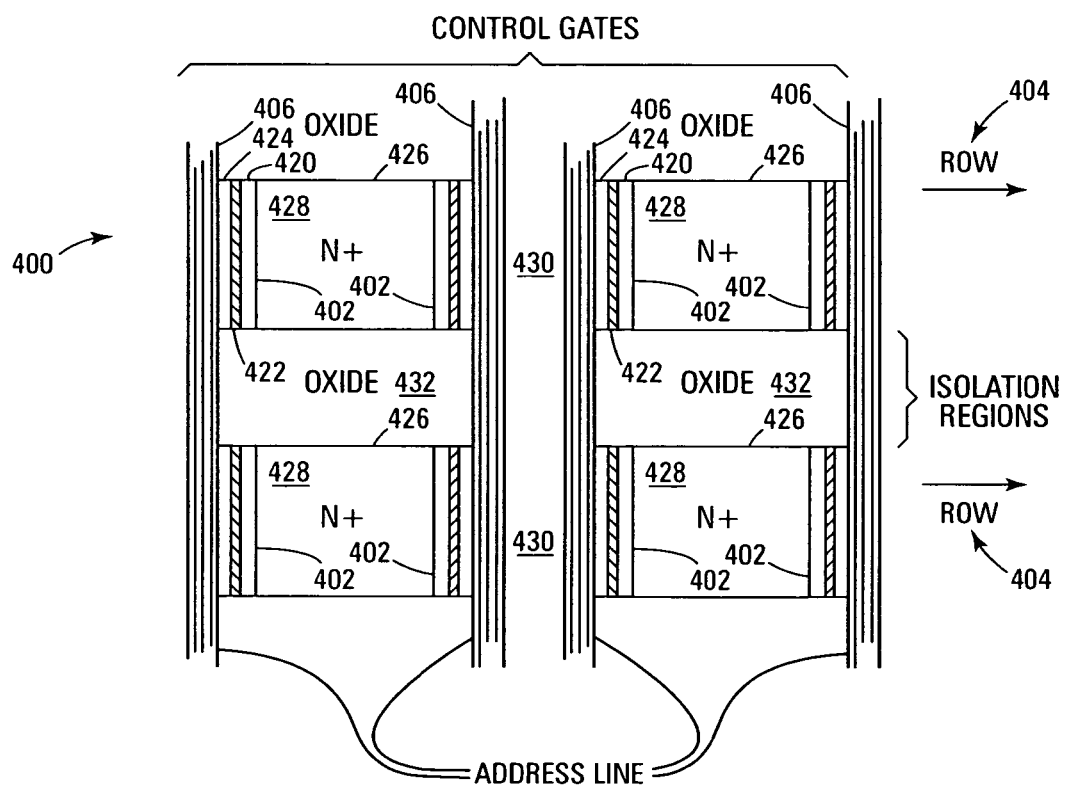

FIGS. 4A–4D details simplified vertical NROM NAND Flash memory cells and array strings of embodiments of the present invention. FIG. 4A details a side view of a simplified vertical NROM NAND Flash memory array string 404 of a NROM NAND Flash memory array 400, a top view of the vertical NROM NAND Flash memory array 400 is detailed in FIG. 4C showing sections of two vertical NROM NAND Flash memory array strings 404. A three dimensional view of the vertical NROM NAND Flash memory array 400 is detailed in FIG. 4D. Methods of forming vertical memory cells are detailed in U.S. patent application Ser. No. 10/177, 208, titled "Vertical NROM having a storage density of 1 bit per $1F^2$", filed Jun. 21, 2002, and U.S. Pat. No. 5,936,274, titled "High density flash memory", issued Aug. 10, 1999, which are commonly assigned. Methods of forming vertical split control gates are detailed U.S. Pat. No. 6,150,687, titled "Memory cell having a vertical transistor with buried source/drain and dual gates", issued Nov. 21, 2000, and U.S. Pat. No. 6,072,209, titled "Four $F^2$ folded bit line DRAM cell structure having buried bit and word lines", issued Jun. 6, 2000, which are also commonly assigned.

In FIG. 4A, a series of vertically formed NROM floating gate memory cells 402 are coupled together in a series NAND string 404 (typically of 8, 16, 32, or more cells). As shown in the detailed section of vertical NROM NAND Flash memory array string 404 of FIG. 4B, in creating the vertical NROM NAND Flash memory array string 404 a series of substrate pillars 428 are formed in a substrate 408 with trenches 430 located between them. The vertical NROM memory cells 402 are then formed on the sidewalls of the pillars 428 within the trenches 430. Each vertical NROM memory cell 402 is formed on the sidewalls of the substrate pillars 428 (for two NROM memory cells 402 per trench 430 and has a gate-insulator stack made of a tunnel insulator 420 formed on the surface of the sidewall, a floating nitride gate 422 formed on the tunnel insulator 420, an intergate insulator 424 formed over the floating gate 422, and a control gate 406 (typically formed in a control gate line, also known as a word line) formed over the intergate insulator 424. In one embodiment the substrate pillars 428 and trenches 430 are formed by patterning a masking material that is layered over the substrate 408 and anisotropically etching the trenches 430. The gate-insulator stack of each NROM memory cell 402 are formed in one embodiment by successive layering of each of the materials of the gate insulator stack over the pillars 428 and trenches 430, followed by a mask and directional etch of the deposit of each layer to leave only the material deposited on the sidewall of the pillars 428. In another embodiment, differing layers of the gate-insulator stack are formed and then masked and directionally etched in a single step.

N+ doped regions 426 are formed at the top of the substrate pillars 428 and at the bottom of the trenches 430 between each vertical NROM memory cell/gate-insulator stack 402 to form the source and drain regions of the adjacent floating gate memory cells 402 and couple the NROM cells 402 together to form the vertical NROM NAND string 404. It is noted that the N+ source/drain regions 426 may be formed before or after the formation of the NROM memory cells/gate-insulator stack 402. Select gates 410, that are coupled to gate select lines, are formed at either end of the NAND floating gate memory string 404 and selectively couple opposite ends of the NAND floating gate memory string 404 to a bit line contact 412 and a source line contact 414.

Figure 4D:
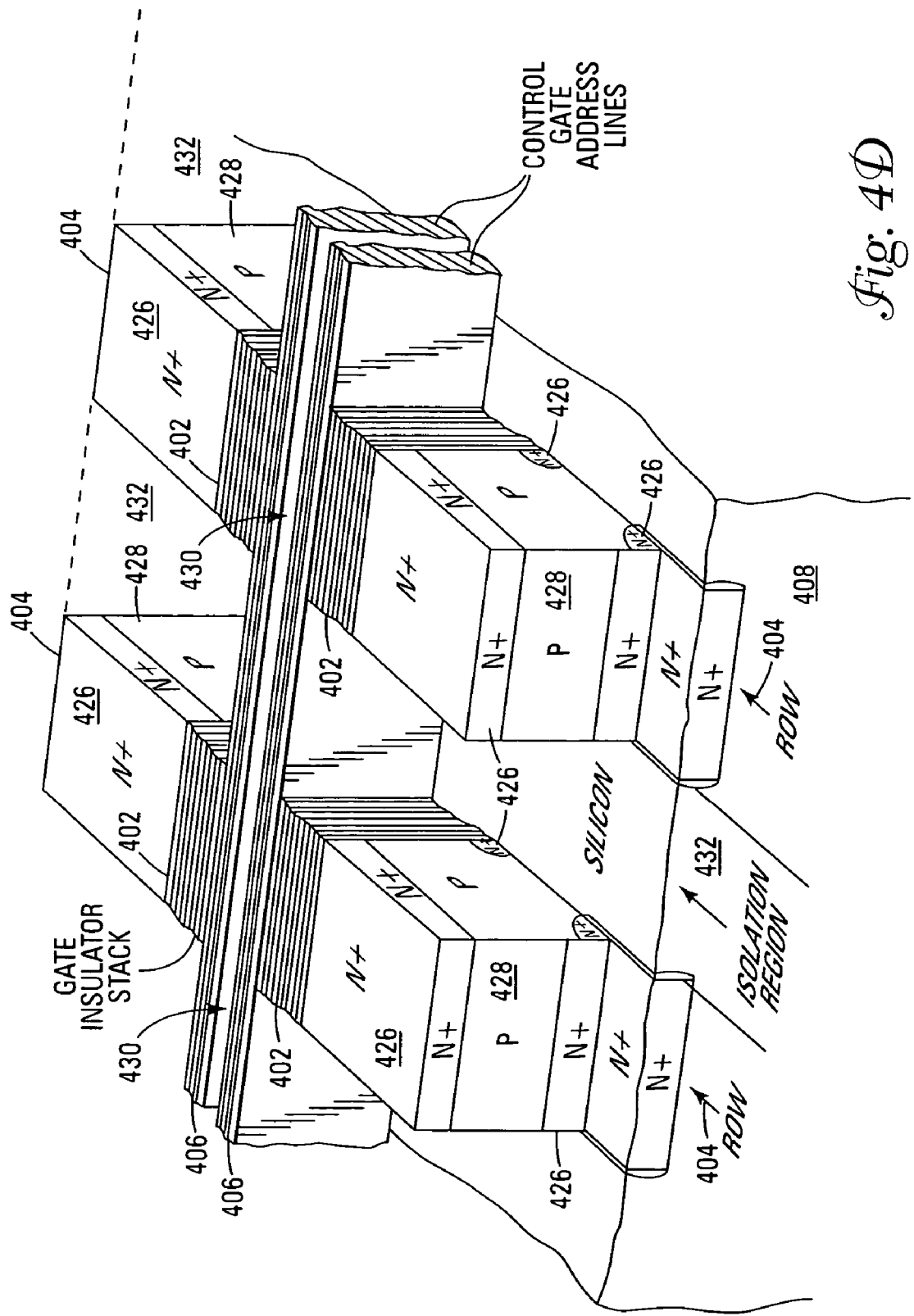

As stated above, in the top view of the vertical NROM NAND Flash memory array 400 of FIG. 4C and in the three dimensional view of FIG. 4D, sections of two vertical NROM NAND Flash memory array strings 404 are shown. Between the substrate pillars 428 of the two vertical NROM NAND Flash memory array strings 404 isolation regions 432 have been formed to isolate the vertical NROM NAND Flash memory array strings 404 from each other. These isolation regions 432 are typically formed of an oxide insulator. It is noted that the isolation regions 432 between the vertical NROM NAND strings 404 can be extended into the substrate 408 to allow the formation P-wells, where each P-well contains a single NROM NAND string 404 and can be biased in isolation from the other strings 404 of the array 400. It is also noted that the control gate/word address lines 406 cross these isolation regions 432 so that each control gate/word address line 406 controls the operation of NROM memory cells 402 across multiple NROM NAND memory strings 404.

In the vertical NROM NAND Flash memory array 400 and strings 404 of FIGS. 4A–4D, the channel length of each NROM memory cell 402 is determined by the depth of the trenches 430 and not by the minimum feature size. Due to the vertical form of the NROM NAND Flash memory array 400 and strings 404 of embodiments of the present invention, a vertical NROM NAND Flash memory array string 404 can be produced that typically has twice the density for a given string horizontal run length than a corresponding planar NROM NAND Flash memory array string 302.

FIG. 5 details vertical NAND NROM cells 402 and substrate 408 of a vertical NROM NAND Flash memory array string 500 in accordance with embodiments of the present invention. In FIG. 5, the substrate 408 of the vertical NROM NAND memory array string 500 is P-doped. A substrate connection 534 is shown, which can allow for biasing of the P-doped substrate 408. It is noted that other forms of substrate doping, substrate biasing, and substrate types and regions (including, but not limited to silicon-on-sapphire (SOS) technology, silicon-on-insulator (SOI) technology, thin film transistor (TFT) technology, doped and undoped semiconductors, epitaxial layers of silicon supported by a base semiconductor) in embodiments of the present invention are possible and should be apparent to those skilled in the art with the benefit of the present invention.

FIG. 6 details an equivalent circuit schematic 600 of a vertical NAND NROM string 404, showing NROM cells 402 and substrate connection 534, in accordance with embodiments of the present invention. As can be seen, the schematic 600 provides the same equivalent circuit as that of a conventional planar NROM NAND string 304.

It is noted that the NROM memory cells of embodiments of the present invention can be formed from multiple conventional materials. For the gate-insulator stack (gate insulator-trapping layer-top insulator) these materials may include, but are not limited to, oxide-nitride-oxide (ONO), oxide-nitride-aluminum oxide, oxide-aluminum oxide-oxide, oxide-silicon oxycarbide-oxide, composite layers of an oxide-an oxide of Ti, Ta, Hf, Zr, or La, and an oxide, and composite layers of an oxide-a non-stoichiometric oxide of Si, N, Al, Ti, Ta, Hf, Zr, and La, and an oxide. Additional trapping layer materials for NROM memory cell embodiments of the present invention, may also include, but are not limited to, wet oxides not annealed, silicon rich oxides, silicon rich aluminum oxide, silicon oxycarbide, silicon oxide with silicon carbide nanoparticles, and non-stoichiometric oxide of Si, N, Al, Ti, Ta, Hf, Zr, and La.

Programming of the NROM memory cells 402 of the vertical NROM NAND Flash memory strings 404 embodiments of the present invention can be accomplished by conventional tunnel injection of electrons by having a positive gate 406 voltage with respect to the substrate or P-well 408. In another embodiment of the present invention, programming is accomplished by channel hot electron injection (HEI). Erasure of the NROM memory cells 402 of embodiments of the present invention can accomplished by conventional tunneling or negative voltages applied to the control gate 406 voltages with respect to the substrate or P-well 408. With the above listed programming and erasure techniques, the NROM memory cells 402 of embodiments of the present invention can be utilized for two-bit storage as a conventional planar NROM memory cells would be, storing charge in the trapping layer near each source/drain 426, allowing one bit to be read/programmed when biased in the forward direction and the other to be read/programmed when biased in the reverse direction.

In alternative embodiments of the present invention, substrate enhanced hot electron injection (SEHE) can be utilized for NROM memory cell 402 programming and/or substrate enhanced band to band tunneling induced hot hole injection (SEBBHH) for NROM memory cell 402 erasure. However, while the required voltages for these operations may be lower, they may only be suitable for single bit storage operation mode.

Figure 7:
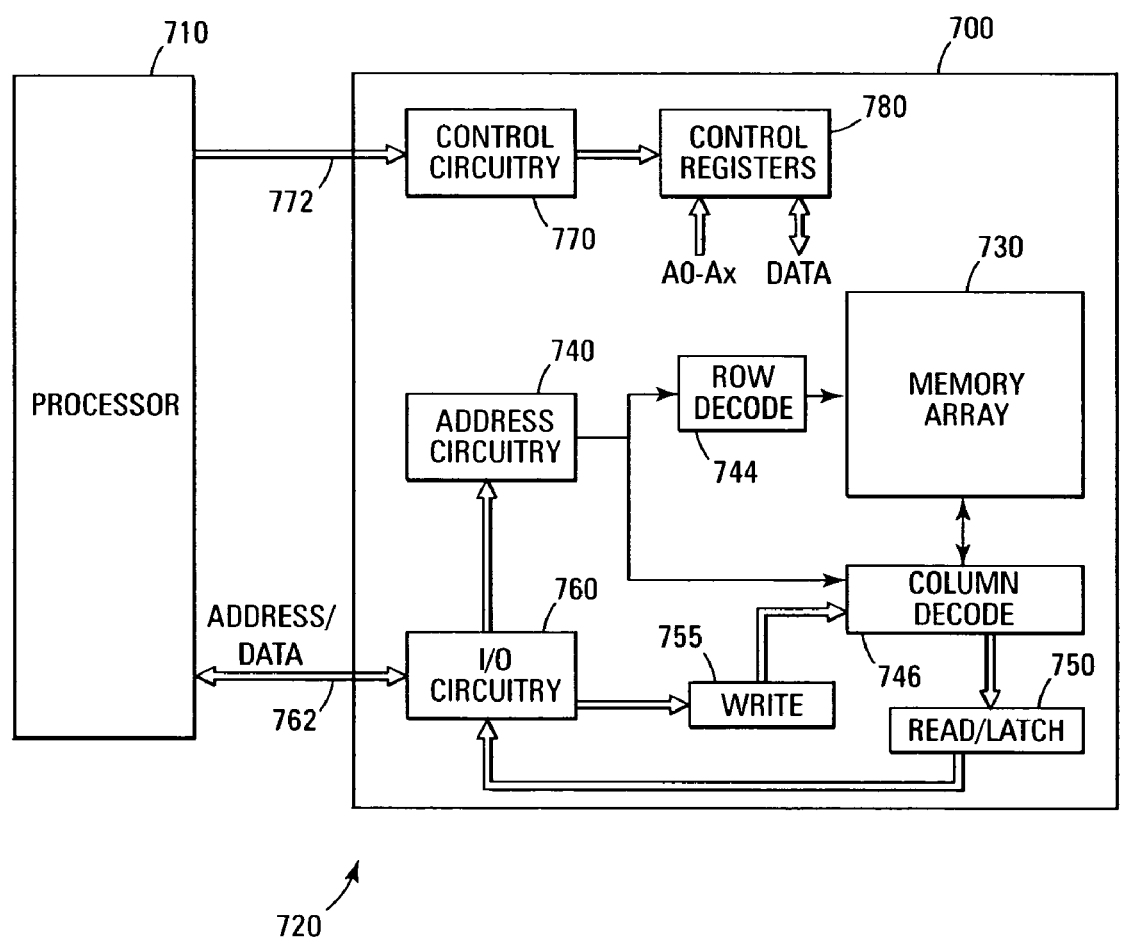
FIG. 7 details a block diagram of an electronic system in accordance with embodiments of the present invention.

FIG. 7 illustrates a functional block diagram of a memory device 700 that can incorporate the vertical NROM Flash memory cells of the present invention. The memory device 700 is coupled to a processor 710. The processor 710 may be a microprocessor or some other type of controlling circuitry. The memory device 700 and the processor 710 form part of an electronic system 720. The memory device 700 has been simplified to focus on features of the memory that are helpful in understanding the present invention.

The memory device includes an array of vertical NROM Flash memory cells 730. In one embodiment, the memory cells are vertical NROM Flash memory cells and the memory array 730 is arranged in banks of rows and columns. The control gates of each row of memory cells are coupled with a wordline while the drain and source connections of the memory cells are coupled to bitlines. As is well known in the art, the connection of the cells to the bitlines depends on whether the array is a NAND architecture or a NOR architecture.

An address buffer circuit 740 is provided to latch address signals provided on address/data bus 762. Address signals are received and decoded by a row decoder 744 and a column decoder 746 to access the memory array 730. It will be appreciated by those skilled in the art, with the benefit of the present description, that the size of address input on the address/data bus 762 depends on the density and architecture of the memory array 730. That is, the size of the input address increases with both increased memory cell counts and increased bank and block counts. It is noted that other address input manners, such as through a separate address bus, are also known and will be understood by those skilled in the art with the benefit of the present description.

The memory device 700 reads data in the memory array 730 by sensing voltage or current changes in the memory array columns using sense/buffer circuitry 750. The sense/buffer circuitry, in one embodiment, is coupled to read and latch a row of data from the memory array 730. Data input and output buffer circuitry 760 is included for bi-directional data communication over a plurality of data connections in the address/data bus 762 with the processor/controller 710. Write circuitry 755 is provided to write data to the memory array.

Control circuitry 770 decodes signals provided on control connections 772 from the processor 710. These signals are used to control the operations on the memory array 730, including data read, data write, and erase operations. The control circuitry 770 may be a state machine, a sequencer, or some other type of controller.

Since the NROM memory cells of the present invention use a CMOS compatible process, the memory device 700 of FIG. 7 may be an embedded device with a CMOS processor.

The Flash memory device illustrated in FIG. 7 has been simplified to facilitate a basic understanding of the features of the memory. A more detailed understanding of internal circuitry and functions of Flash memories are known to those skilled in the art.

It is also noted that other vertical NROM NAND memory strings, arrays, and memory devices in accordance with embodiments of the present invention are possible and should be apparent to those skilled in the art with benefit of the present disclosure.

CONCLUSION

Memory devices, arrays, and strings have been described that facilitate the use of NROM memory cells in NAND architecture memory strings, arrays, and devices. NROM NAND architecture memory embodiments of the present invention include NROM memory cells in high density vertical NAND architecture arrays or strings facilitating the use of reduced feature size process techniques, e.g., 0.1 µm or below. These NAND architecture vertical NROM memory cell strings allow for an improved high density memory devices or arrays that can take advantage of the feature sizes semiconductor fabrication processes are generally capable of and yet do not suffer from charge separation issues in multi-bit NROM cells.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of forming a vertical NROM NAND architecture memory cell string, comprising:
   forming one or more raised areas on a substrate, the raised areas defining intervening trenches; and
   forming a plurality of NROM memory cells on sidewalls of the one or more raised areas by,
      forming a plurality of gate-insulator stacks on a surface of a plurality of sidewalls,
      forming a plurality of word lines, wherein each intervening trench contains two word lines and where each word line is coupled to a control gate of a single NROM memory cell of the vertical NROM NAND architecture memory string, and
      forming one or more source/drain regions on the top of the one or more raised areas and at the bottom of the intervening trenches.

2. The method of claim 1, wherein forming one or more raised areas on a substrate further comprises forming one or more pillars on a substrate by forming two or more second trenches, where the two or more second trenches are oriented generally perpendicular to the intervening trenches.

3. The method of claim 1, wherein forming one or more source/drain regions on the top of the one or more raised areas and at the bottom of the intervening trenches further comprises forming one or more source/drain regions on the top of the one or more raised areas and at the bottom of the intervening trenches in one of before the formation of the plurality of gate-insulator stacks and after the formation of the plurality of gate-insulator stacks.

4. The method of claim 1, wherein the substrate is P-doped.

5. The method of claim 1, wherein forming a plurality of gate-insulator stacks on a surface of a plurality of sidewalls further comprises selectively forming a plurality of gate-insulator stacks on the surface of the plurality of sidewalls.

6. The method of claim 5, wherein selectively forming a plurality of gate-insulator stacks on the surface of a plurality of sidewalls further comprises forming a tunnel insulator on the surface of the plurality of selected sidewalls, forming a trapping layer on the tunnel insulator, forming an intergate insulator over the trapping layer, and forming a control gate over the intergate insulator.

7. The method of claim 6, wherein forming a tunnel insulator on the surface of the plurality of selected sidewalls, forming a trapping layer on the tunnel insulator, forming an intergate insulator over the trapping layer, and forming a control gate over the intergate insulator further comprises depositing each separate layer of tunnel insulator, nitride trapping layer, intergate insulator, and control gate over the one or more raised areas and/or trenches, and masking and directionally etching each layer.

8. The method of claim 6, wherein forming a tunnel insulator on the surface of the plurality of selected sidewalls, forming a trapping layer on the tunnel insulator, forming an intergate insulator over the trapping layer, and forming a control gate over the intergate insulator further comprises depositing layers of tunnel insulator, nitride trapping layer, integrate insulator, and control gate over the one or more raised areas and intervening trenches, and masking and directionally etching the combined layers to produce the gate-insulator stack.

9. The method of claim 5, wherein selectively forming a plurality of gate-insulator stacks on the surface of a plurality of sidewalls further comprises forming a gate-insulator stack of one of oxide-nitride-oxide (ONO), oxide-nitride-aluminum oxide, oxide-aluminum oxide-oxide, oxide-silicon oxy-carbide-oxide, composite layers of an oxide-an oxide of Ti, Ta, Hf, Zr, or La, and an oxide, composite layers of an oxide-a non-stoichiometric oxide of Si, N, Al, Ti, Ta, Hf, Zr, and La, and an oxide, composite layers of an oxide-a wet oxide not annealed, and an oxide, composite layers of an oxide-a silicon rich oxide, and an oxide, composite layers of an oxide-a silicon rich aluminum oxide, and an oxide, and composite layers of an oxide-a silicon oxide with silicon carbide nanoparticles, and an oxide.

10. A method of forming a vertical NROM NAND architecture memory array, comprising:
   forming a plurality of pillars and associated intervening trenches on a substrate, wherein a first set of intervening trenches are formed generally perpendicular to a second set of intervening trenches; and
   forming a plurality of NROM memory cells on sidewalls of the plurality of pillars by, forming a plurality of gate-insulator stacks on a surface of a plurality of sidewalls of the first set of intervening trenches, forming one or more source/drain regions on the top of the plurality of pillars and at the bottom of the first set of intervening trenches to form a plurality of NROM NAND architecture memory strings, and forming a plurality of word lines, wherein each trench of the first set of intervening trenches contains two word lines and where each word line is coupled to a control gate of a single NROM memory cell of each NROM NAND architecture memory string.

11. The method of claim 10, wherein the substrate is P-doped.

12. The method of claim 10, further comprising:
forming a P-well isolation region under each NROM NAND architecture memory string.

13. The method of claim 10, further comprising:
forming an isolation region between adjacent NROM NAND architecture memory strings.

14. The method of claim 13, wherein forming an isolation region between adjacent NROM NAND architecture memory strings further comprises forming an isolation region of an oxide insulator.

15. The method of claim 13, wherein forming an isolation region between adjacent NROM NAND architecture memory strings further comprises forming the plurality of word lines across the isolation region between adjacent NROM NAND architecture memory strings, wherein each word line is coupled to a control gate of a single NROM memory cell of each NROM NAND architecture memory string.

16. The method of claim 10, wherein forming one or more source/drain regions on the top of the plurality of pillars and at the bottom of the first set of intervening trenches further comprises forming one or more source/drain regions on the top of the plurality of pillars and at the bottom of the first set of intervening trenches in one of before the formation of the plurality of NROM memory cells and after the formation of the plurality of NROM memory cells.

17. The method of claim 10, wherein forming a plurality of NROM memory cells on the sidewalls of the plurality of pillars and first set of intervening trenches further comprises forming a plurality of NROM memory cells on the sidewalls of the plurality of pillars and first set of intervening trenches by forming a gate-insulator stack on the surface of a plurality of selected sidewalls.

18. The method of claim 17, wherein forming a gate-insulator stack on the surface of a plurality of selected sidewalls further comprises forming a tunnel insulator on the surface of the plurality of selected sidewalls, forming a trapping layer on the tunnel insulator, forming an intergate insulator over the trapping layer, and forming a control gate over the intergate insulator.

19. The method of claim 18, wherein forming a tunnel insulator on the surface of the plurality of selected sidewalls, forming a trapping layer on the tunnel insulator, forming an intergate insulator over the trapping layer, and forming a control gate over the intergate insulator further comprises depositing each separate layer of tunnel insulator, nitride, integrate insulator, and control gate over the plurality of pillars and trenches, and masking and directionally etching each layer.

20. The method of claim 18, wherein forming a tunnel insulator on the surface of the plurality of selected sidewalls, forming a trapping layer on the tunnel insulator, forming an intergate insulator over the trapping layer, and forming a control gate over the intergate insulator further comprises depositing layers of tunnel insulator, nitride, integrate insulator, and control gate over the plurality of pillars and trenches, and masking and directionally etching the combined layers to produce the gate-insulator stack.

21. The method of claim 17, wherein forming a gate-insulator stack on the surface of a plurality of selected sidewalls further comprises forming a gate-insulator stack of one of oxide-nitride-oxide (ONO), oxide-nitride-aluminum oxide, oxide-aluminum oxide-oxide, oxide-silicon oxycarbide-oxide, composite layers of an oxide-an oxide of Ti, Ta, Hf, Zr, or La, and an oxide, composite layers of an oxide-a non-stoichiometric oxide of Si, N, Al, Ti, Ta, Hf, Zr, and La, and an oxide, composite layers of an oxide-a wet oxide not annealed, and an oxide, composite layers of an oxide-a silicon rich oxide, and an oxide, composite layers of an oxide-a silicon rich aluminum oxide, and an oxide, and composite layers of an oxide-a silicon oxide with silicon carbide nanoparticles, and an oxide.

* * * * *

UNITED STATES PATENT AND TRADEMARK OFFICE
CERTIFICATE OF CORRECTION

PATENT NO.        : 7,241,654 B2                                           Page 1 of 1
APPLICATION NO.   : 10/738783
DATED             : July 10, 2007
INVENTOR(S)       : Forbes It is certified that error appears in the above-identified patent and that said Letters Patent is hereby corrected as shown below:

In column 10, line 40, in Claim 8, after "nitride" delete "trapping layer," and insert -- , --, therefor.

In column 10, line 41, in Claim 8, delete "integrate" and insert -- intergate --, therefor.

In column 12, line 17, in Claim 19, delete "integrate" and insert -- intergate --, therefor.

In column 12, line 25, in Claim 20, delete "integrate" and insert -- intergate --, therefor.

Signed and Sealed this

Twenty-fifth Day of March, 2008

JON W. DUDAS
*Director of the United States Patent and Trademark Office*